United States Patent
Szu

(10) Patent No.: US 7,651,357 B2
(45) Date of Patent: Jan. 26, 2010

(54) IC SOCKET

(75) Inventor: Ming-Lun Szu, Tu-cheng (TW)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 0 days.

(21) Appl. No.: 12/284,298

(22) Filed: Sep. 18, 2008

(65) Prior Publication Data

US 2009/0075499 A1 Mar. 19, 2009

(30) Foreign Application Priority Data

Sep. 18, 2007 (CN) .................... 2007 2 0046656 U

(51) Int. Cl.
*H01R 13/62* (2006.01)
(52) U.S. Cl. ........................................ 439/331; 439/70
(58) Field of Classification Search ................ 439/331, 439/330, 70–73, 342
See application file for complete search history.

(56) References Cited

U.S. PATENT DOCUMENTS

| 6,890,202 | B2* | 5/2005 | Yasufuku et al. ............ 439/331 |
| 7,448,879 | B2* | 11/2008 | Jin ............................... 439/71 |
| 2004/0259407 | A1* | 12/2004 | Chiang ....................... 439/331 |
| 2007/0238327 | A1* | 10/2007 | Hsu ............................ 439/70 |

FOREIGN PATENT DOCUMENTS

CN 2924841 7/2007

* cited by examiner

*Primary Examiner*—Hien Vu
(74) *Attorney, Agent, or Firm*—Andrew C. Cheng; Wei Te Chung; Ming Chieh Chang

(57) ABSTRACT

An IC socket comprises an insulative housing having a plurality of periphery walls and a cover pivotally assembled to one end of the insulative housing and adapted to be locked to the insulative housing at the other end. The cover includes a plurality of peripheral edges. The cover also has a plurality of spring arms upwardly extending therefrom and disposed at the edges.

5 Claims, 4 Drawing Sheets

IC SOCKET

BACKGROUND OF THE INVENTION

1. Field of the Invention

The present invention relates to an integrated circuit (IC) socket, and more particularly, to an IC socket for supporting a heat sink to distribute part of force that the heat sink is seated on the electronic package so as to prevent deformation of an electronic package.

2. Description of the Prior Art

An Land Grid Array socket generally comprises an insulative housing, a plurality of contacts received in the insulative housing and a fasten member. The fasten member comprises a stiffener surrounded the insulative housing, a load plate assembled to one end of the stiffener to urge an electronic package received in the insulative housing and a lever assembled to the other end of the stiffener to lock the load plate in a close position. The insulative housing secures the electronic package by the fasten member and then is soldered on a printed circuit board to establish an electrical connection between the electronic package and the printed circuit board.

However, the fasten member of the IC socket comprises a lot of members and the fastening process is complex, therefore, the cost of the IC socket is high.

CN Pat. No. 2924841 issued to Molex on Jul. 18, 2007 discloses a present IC socket, which could solve said problem which is descripted above. The IC socket comprises an insulative housing and a cover assembled to one end of the insulative housing. The cover has an urging portion at a corner thereof for pushing the electronic package to be located in the insulative housing. Understandably, there will be a heat sink assembled upon the electronic package and the heat sink has a weight itself and will generate shake in running process. According, the electronic package will generate deflection under the long term of load and shake. Under that condition, the life of the electronic package will be reduced. Therefore, an improved IC socket is needed to prevent the deflection of the electronic package to extend the life of the electronic package.

SUMMARY OF THE INVENTION

Accordingly, an object of the present invention is to provide an IC socket with an improved structure to support a heat sink to distribute part of load that the heat sink is seated on the electronic package for preventing deformation of an electronic package In order to achieve the object set forth, an IC socket comprises an insulative housing having a plurality of periphery walls and a cover pivotally assembled to one end of the insulative housing and adapted to be locked to the insulative housing at the other end. The cover includes a plurality of peripheral edges. The cover also has a plurality of spring arms upwardly extending therefrom and disposed at the edges.

In order to further achieve the object set forth, an IC socket for using with an electronic package and a heat sink, comprises an insulative housing and a cover pivotally mounted to the insulative housing for pressing the electronic package secured in the insulative housing. The insulative housing includes a bottom surface and a plurality of peripheral walls commonly defining an upward receiving cavity for receiving the electronic package. Outer side of the cover have a plurality of upwardly extending spring arms for supporting a bottom surface of the heat sink.

DESCRIPTION OF PREFERRED EMBODIMENT

Reference will now be made to the drawings to describe the present invention in detail.

Figure 1:
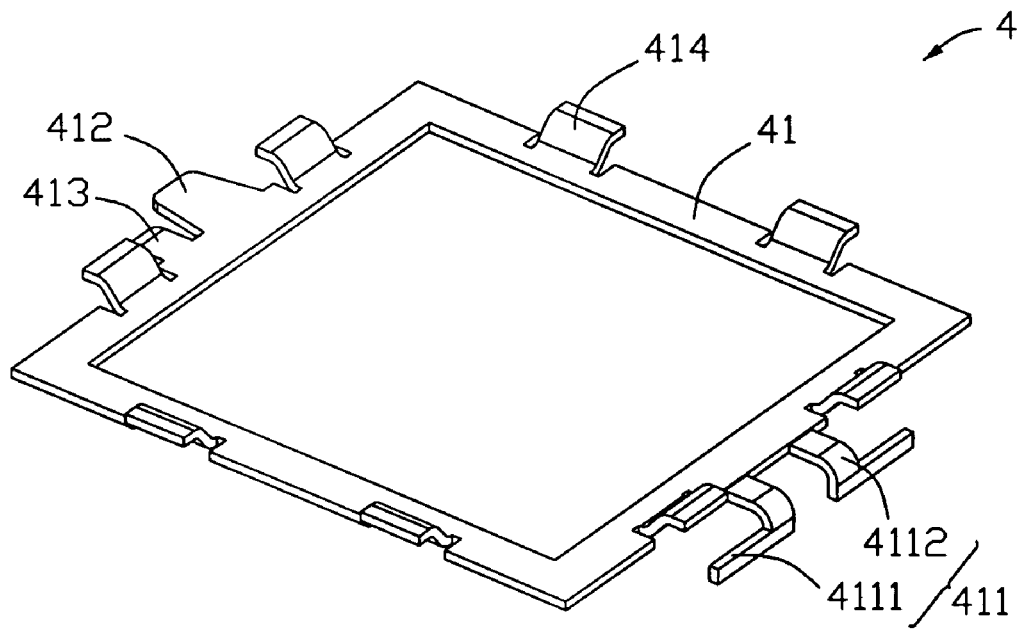
FIG. 1 is an exploded view of an IC socket in accordance with the present invention.
Figure 1:
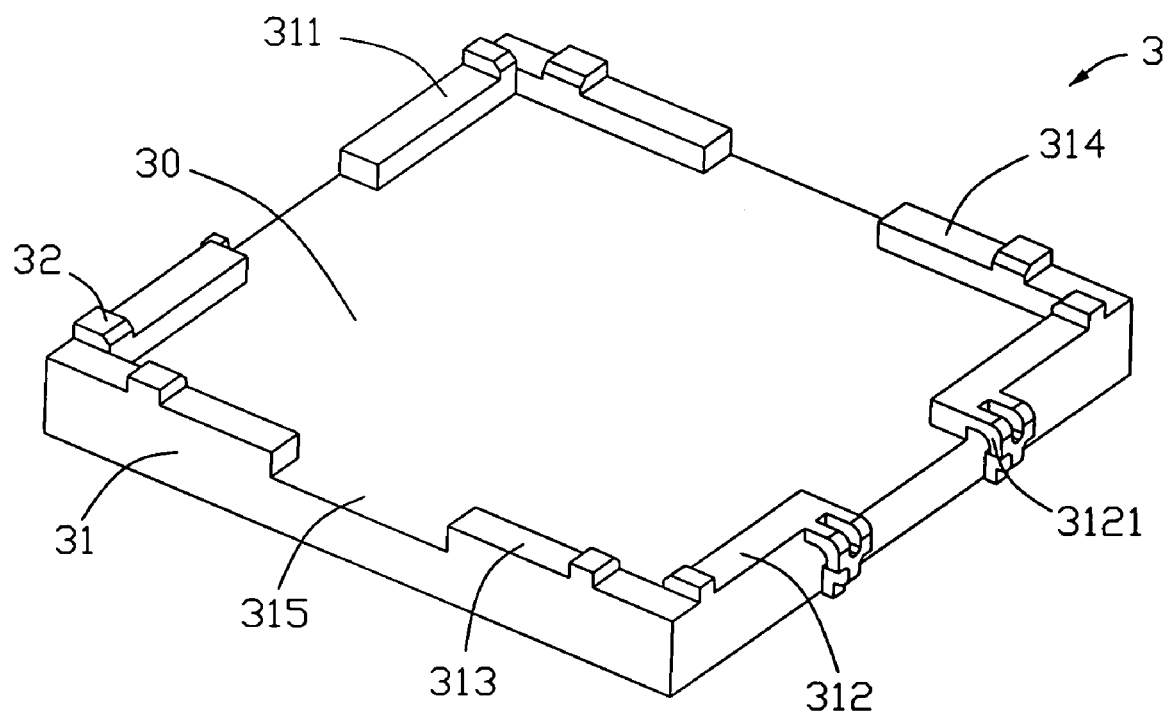
Figure 2:
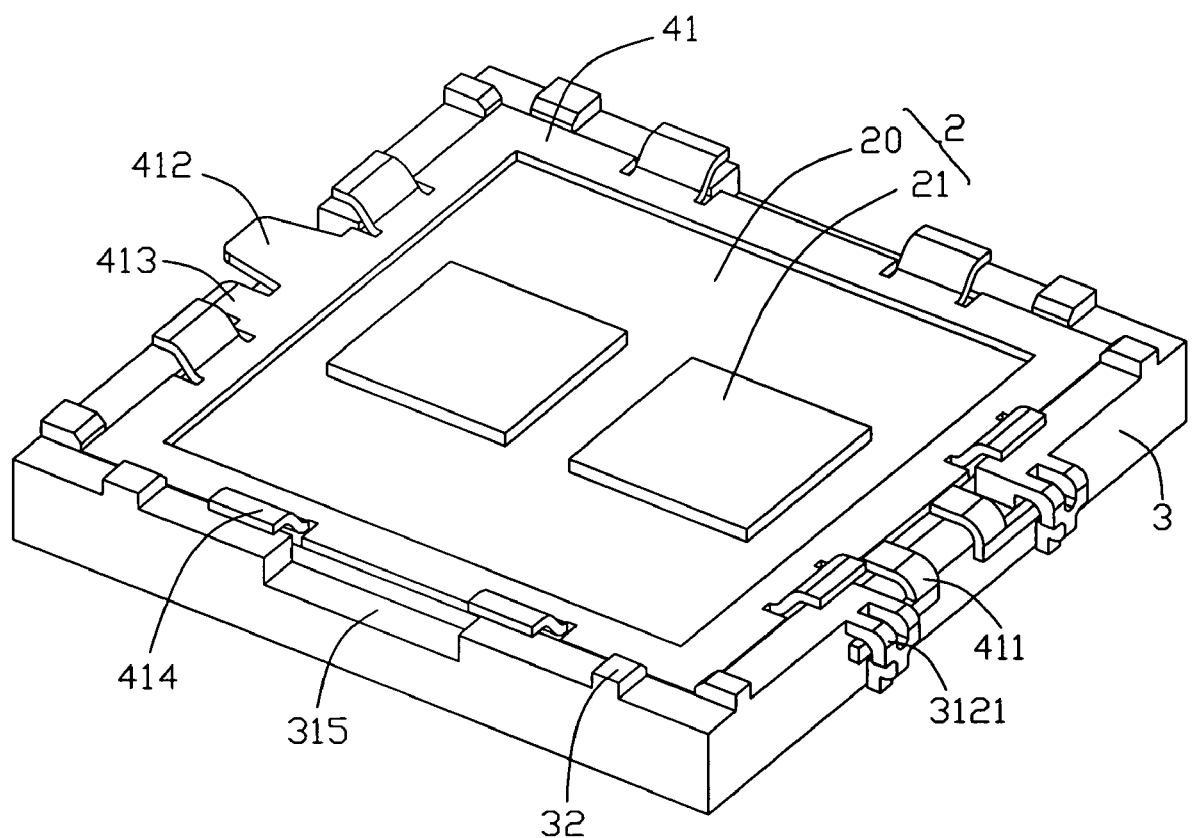
FIG. 2 is an assemble view of the IC socket shown in FIG. 1 with an electronic package assembled thereon.
Figure 3:
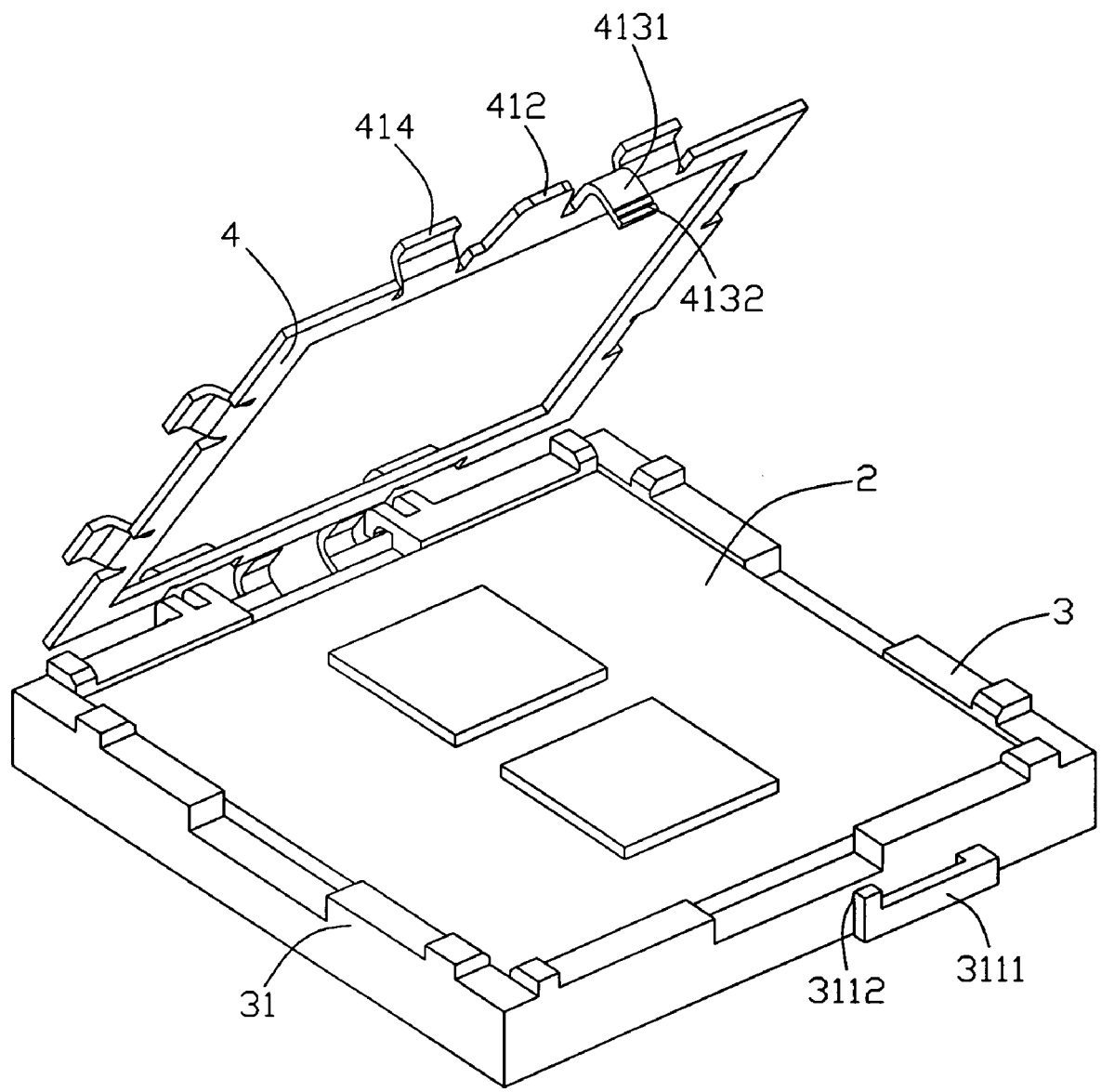
FIG. 3 is similar to FIG. 2, with the IC socket in an open position.

Referring to FIG. 1 and FIG. 3, an IC socket is used for electrically connecting an electronic package 2 and a printed circuit board (not shown). The electronic package 2 is substantially formed a rectangular shape and includes a planar substrate 20 and two dies 21 mounted upon a top surface of the substrate 20. The IC socket includes an insulative housing 3, a plurality of contacts (not shown) received in the insulative housing 3 and a cover 4.

The insulative housing 3 is essentially of a rectangular configuration. The insulative housing 3 has a base 30 with a plurality of passageways (not shown) and a plurality of periphery walls 31 and commonly defining an upward receiving cavity (not labeled) for receiving the electronic package 2. The periphery walls 31 are called front sidewall 311, rear sidewall 312, left sidewall 313 and right sidewall 314 in accordance to the position which they are disposed on the insulative housing 3.

The left and right sidewalls 313, 314 have cutouts as pick-up slots 315 for the convenience of runners to assemble and pick-up the electronic package 2. The rear sidewall 312 has a pair of hooks 3121 in a vertical direction with openings toward downwardly and the front sidewall 311 has an engaging portion adapted to lock the cover 4 in a close position. In present embodiment, the engaging portion is a pair of spring cantilevered arms 3111 extending from the front sidewall 311 in the vertical direction and substantially parallel to a vertical sidewall. The spring cantilevered arm 3111 is substantially extending in a horizontal direction with a tab 3112 extending in the vertical direction. The periphery sidewalls 31 have a plurality of small protrusions 32 extending upwardly therefrom so that the cover 4 can be applied to the electronic package 2 on the desired location.

The cover 4 has a planar frame 41. The frame 41 defines a front end, rear end, left end and right end corresponding to the periphery walls 31. The rear end of the frame 41 forms a pair of pivotal portions 411 corresponding to the hooks 3121. The pivotal portions 411 are symmetrically aligned. Each pivotal portion 411 includes a bent portion 4111 extending rearward firstly and then extending downwardly, a pivotal axis 4112 connected with the bent portion 4111 and perpendicular to the bent portion 4111 and opposite to the other pivotal portion 411. Each pivotal axis 4112 is extended in the horizontal direction and received in the hook 3121 for pivotal rotation with regard to the insulative housing 3. The front end of the frame 41 has a pick-up portion 412 extending forward to open and close the cover 4. The front end of the frame 41 also has a latch 413 with a locking portion 4131 bent downwardly for engaging with the spring cantilevered arms 3111. The locking portion 4131 has a plurality of slots 4132 adapt to lock to the spring cantilevered arms 3111.

The peripheral borders of the frame 41 have a plurality of spring arms 414 extending upwardly. The spring arms 414 are uniformed disposed on each edge of the frame 41 and have substantially horizontal supporting portions 4141 for supporting a heat sink 5 which is mounted upon the electrical package 2. The number of the spring arms 414 could be disposed in accordance to actual enablement. In present embodiment, there are eight spring arms 41 and each edge of the frame 41 has two.

In assembly, firstly, the pivotal portions 411 of the cover 4 are aligned to the hooks 3121 of the insulative housing 3, open the cover 4 and put the electronic package 2 to the insulative housing 3. Then, rotate the cover 4 to the close position and lock the locking portion 4131 to the tab 3112 of the spring cantilevered arms 3111. Now, the electronic package 2 is mounted to the IC socket and could establish an electrical connection between the electronic package 2 and the printed circuit board by the contacts. Last, the heat sink 5 is assembled upon the electronic package 2 and is secured to the printed circuit board by nuts.

Figure 4:
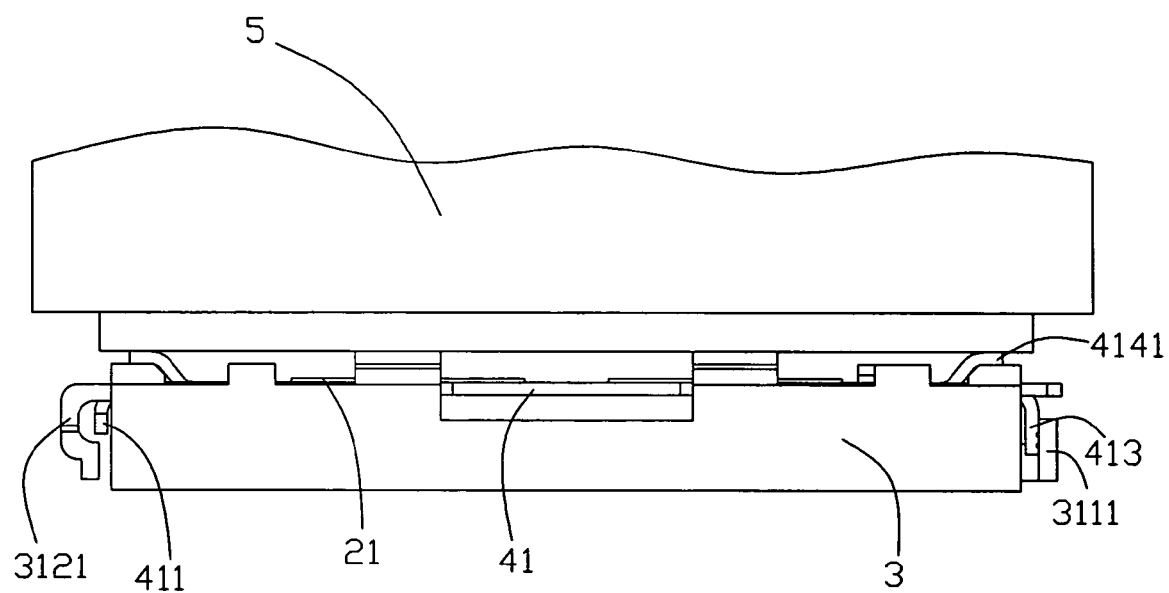
FIG. 4 is a side view of the IC socket shown in FIG. 2, while a heat sink is assembled to the IC socket and the electronic package.

Referring to FIG. 4, shown a side view of the heat sink 5 begin to assemble to the IC socket and the electronic package. After assembled the electronic package 2 to the IC socket, the supporting portions 4141 of the spring arms 414 are formed a common surface witch is higher than the dies 21 of the electronic package 2. The supporting portions 4141 are extended above the periphery walls 31 of the insulative housing 3 and have a distance with the periphery walls 31 in a vertical direction. In process of assembling the heat sink 5 to the electronic package 2, the bottom surface of the heat sink 5 touches the supporting portions 4141 firstly and then presses the supporting portions 4141 downwardly until to touch the dies 21 of the electronic package 2. When the heat sink 5 touches the die 21, the supporting portions 4141 of the spring arms may touch to the periphery walls 31 or not. In the present embodiment, the supporting portions 4141 touch the periphery walls 31 when the heat sink 5 is located in the last position.

In present invention, the heat sink 5 applies a loading force between the spring arms 414 and the dies 21. The spring arms 414 could share parts of the loading force for the dies 21, and the total loading force that the spring arms 414 have can be changed by changing the number of spring arms 414. The structure of the spring arms 414 are used to distribute parts of the loading force that the heat sink 5 is seated on the electronic package 2 to present deflection of the electronic package 2.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An IC socket comprising:
    an insulative housing having a plurality of periphery walls; and a cover pivotally assembled to one end of the insulative housing and adapted to be locked to the insulative housing at the other end, the cover including a planar frame having a receiving opening and a plurality of peripheral edges;
    wherein the cover has a plurality of spring arms upwardly extending from the peripheral edges and disposed at the edges thereof;
    wherein the spring arms have substantially horizontal supporting portion at free ends thereof;
    wherein the periphery walls includes a front sidewall, a rear sidewall, a left sidewall and a right sidewall, each of the sidewalls having protrusions extending upwardly;
    wherein the rear sidewall has a pair of hooks in a vertical direction with openings toward downwardly, and wherein the cover has a pair of pivotal portions engaging with the hooks;
    wherein the pair of pivotal portions are symmetrically aligned, and each pivotal portion includes a bent portion extending rearward firstly and then downwardly extending, a pivotal axis connected with the bent portion and vertically to the bent portion and pointed opposite to the other pivotal portion; and
    wherein the front sidewall has an engaging portion in a vertical direction and the cover has latch bent downwardly for engaging with the engaging portion.

2. The IC socket as claimed in claim 1, wherein the cover has a pick-up portion at a front end thereof.

3. The socket as claimed in claim 1, wherein the engaging portion is a spring cantilevered arm and substantially paralleled to the front sidewall in the vertical direction.

4. A socket for using with an electronic package and heat sink, comprising:
    an insulative housing including a bottom surface and a plurality of peripheral walls having a front sidewall, a rear sidewall, a left sidewall and a right sidewall and commonly defining an upward receiving cavity for receiving the electronic package;
    a cover including a planar frame having a receiving opening pivotally mounted to the insulative housing for pressing the electronic package secured in the receiving package;
    a plurality of upwardly extending spring arms disposed on a top of the planar frame for supporting a bottom surface of the heat sink;
    wherein a free end of the spring arm has a substantially horizontal supporting portion;
    wherein all supporting portions of the spring arms are formed in a common surface, and the common surface is higher than the top surface of the electronic package when the package is received in the receiving cavity;
    wherein the periphery sidewalls have a plurality of small protrusions extending upwardly thereupon to align the cover to the receiving cavity of the insulative housing;
    wherein the rear sidewall has a pair of hooks in a vertical direction with openings toward downwardly, and wherein the cover has a pair of pivotal portions engaging with the hooks; and
    wherein the pair of pivotal portions are symmetrically aligned, and each pivotal portion includes a bent portion extending rearward firstly and then downwardly extending, a pivotal axis connected with the bent portion and vertically to the bent portion and pointed opposite to the other pivotal portion.

5. The socket as claimed in claim 4, wherein the supporting portions extend above the periphery walls and have a distance with the periphery walls in a vertical direction.

* * * * *